(12) United States Patent
Lee et al.

(10) Patent No.: US 11,073,440 B2
(45) Date of Patent: Jul. 27, 2021

(54) HERMETIC SEALED BEAM PROJECTOR MODULE AND METHOD FOR MANUFACTURING THE SAME

(71) Applicant: Namuga, Co., Ltd., Seongnam-si (KR)

(72) Inventors: Jun Youb Lee, Seongnam-si (KR); Young Gyu Kang, Yongin-si (KR); Jeong Hwa Seo, Seongnam-si (KR)

(73) Assignee: Namuga, Co., Ltd., Seongnam-si (KR)

( * ) Notice: Subject to any disclaimer, the term of this patent is extended or adjusted under 35 U.S.C. 154(b) by 175 days.

(21) Appl. No.: 16/525,828

(22) Filed: Jul. 30, 2019

(65) Prior Publication Data
US 2020/0041372 A1    Feb. 6, 2020

(30) Foreign Application Priority Data

Jul. 31, 2018 (KR) .................. 10-2018-0089374
Jul. 16, 2019 (KR) .................. 10-2019-0085441

(51) Int. Cl.

| G01L 19/14 | (2006.01) |
|---|---|
| H01S 5/183 | (2006.01) |
| H01S 5/06 | (2006.01) |
| H01S 5/068 | (2006.01) |
| H01S 5/0222 | (2021.01) |
| H01S 5/02257 | (2021.01) |

(52) U.S. Cl.
CPC .......... *G01L 19/147* (2013.01); *H01S 5/0222* (2013.01); *H01S 5/02257* (2021.01); *H01S 5/0607* (2013.01); *H01S 5/06804* (2013.01); *H01S 5/06825* (2013.01); *H01S 5/183* (2013.01)

(58) Field of Classification Search
CPC ............... G01L 19/147; H01S 5/02257; H01S 5/0222; H01S 5/06804; H01S 5/06825; H01S 5/183; H01S 5/0607
See application file for complete search history.

(56) References Cited

U.S. PATENT DOCUMENTS

| 6,960,032 B2 | 11/2005 | Eldring et al. |
| 10,069,275 B1 * | 9/2018 | Lee ...................... H01S 5/02257 |
| 10,444,331 B1 * | 10/2019 | Lee ......................... G01S 17/08 |
| 2017/0353004 A1 * | 12/2017 | Chen ................... H01S 5/02257 |
| 2019/0131767 A1 | 5/2019 | Lee et al. |

* cited by examiner

Primary Examiner — Ryan D Walsh
(74) Attorney, Agent, or Firm — Meunier Carlin & Curfman LLC

(57) ABSTRACT

An embodiment provides a beam projector module including: a light source configured to output light; a substrate configured to support the light source; an optical device configured to reduce the light in terms of intensity output to a predetermined space; a frame configured to separate the optical device from the light source by a predetermined distance; an optical substrate configured to attach the optical device thereto and to define a sealed space with the substrate and the frame, the sealed space having internal pressure lower than pressure outside the sealed space; a sensor configured to measure a state of the sealed space; and a processor configured to change an operation mode of the light source depending on a measured value of the sensor.

18 Claims, 19 Drawing Sheets

(step 1)

(step 2)

(step 3)

(step 4)

HERMETIC SEALED BEAM PROJECTOR MODULE AND METHOD FOR MANUFACTURING THE SAME

CROSS REFERENCE TO RELATED APPLICATION

This application claims priority from Korean Patent Application No. 10-2018-0089374, filed on Jul. 31, 2018 and Korean Patent Application No. 10-2019-0085441, filed on Jul. 16, 2019, both of which are hereby incorporated by reference for all purposes as if fully set forth herein.

BACKGROUND OF THE INVENTION

1. Field of the Invention

The present disclosure relates to a beam projector module.

2. Description of the Prior Art

LASER is an acronym for "Light Amplification by Stimulated Emission of Radiation". Lasers are capable of outputting light in an intensive and condensed manner. In addition, lasers may have monochromaticity and directivity, and due to this characteristic, lasers are widely utilized in the field of optical sensor technology.

For example, a laser may be utilized as a light source of a distance-measuring device, and may be utilized as a light source of a 3D depth camera. A Time of Flight (ToF) type distance-measuring device is capable of measuring the traveling distance of pulsed light waves output from a light source and returned by being reflected by an object by using a phase difference, and measuring a distance using the phase difference and frequency information. A Structure Light (SL) or a hybrid stereo type distance-measuring device is capable of extracting distance information by forming a regular or irregular pattern through a diffuser using a laser light source as a source.

Due to the high output and directivity thereof, lasers are used as sources of distance measurement and 3D depth cameras.

Meanwhile, the high output characteristic of lasers may be recognized as an advantage in view of the fact that it is possible to increase the travel distance of light and to maintain the output of the returned light higher than a certain level, but may be recognized as a disadvantage in view of safety. When high-power light is directly radiated to a person's eye, it may damage the eye and, in extreme cases, may cause blindness. Accordingly, when using a laser as a light source, it is always necessary to consider a safety problem.

In general, each country has an eye-safety standard requiring that the intensity of light output from a device be adjusted to be a reference value or less.

One of the methods of adjusting the intensity of output light is to place a diffuser capable of reducing the intensity of light on the output path of the light. Since the diffuser disperses the concentrated light to a predetermined field of view (FOV) required by the system by the effects of refraction and diffraction using the property of light, the intensity of light passing through the diffuser is reduced per unit area.

However, in a device for adjusting the intensity of light using the diffuser as described above, when the diffuser is detached, high-output light is output as it is, which may cause a problem in safety.

SUMMARY OF THE INVENTION

In this context, the embodiments disclosed herein provide a technique for a beam projector module that provides an eye-safety function.

In view of the foregoing, an embodiment provides a beam projector module including: a light source configured to output light; a substrate configured to support the light source; an optical device configured to reduce the light in terms of intensity output to a predetermined space; a frame configured to separate the optical device from the light source by a predetermined distance; an optical substrate configured to attach the optical device thereto and to define a sealed space with the substrate and the frame, the sealed space having internal pressure lower than pressure outside the sealed space; a sensor configured to measure a state of the sealed space; and a processor configured to change an operation mode of the light source depending on a measured value of the sensor.

In the beam projector module, the sealed space may be filled with an inert gas, and pressure of the inert gas may be lower than air pressure outside the frame.

In the beam projector module, the processor may be configured to operate the light source in an eye-safety mode when the measured value of the pressure sensor is higher than a reference pressure value.

In the beam projector module, the pressure sensor may be configured to measure the pressure in the sealed space.

In the beam projector module, the sensor may be a pressure sensor, the pressure sensor may be located in a bonded portion between two of the substrate, the frame, and the optical substrate to measure a bonding force of the bonded portion, and the processor may be configured to operate the light source in an eye-safety mode when the measured value of the pressure sensor is lower than a reference pressure value.

In the beam projector module, the pressure sensor may be disposed on the substrate, and a portion of the frame may be bonded to the substrate with pressing the pressure sensor.

In the beam projector module, the pressure sensor may be located in a bonded portion between the frame and the optical substrate, and a wiring line connecting the pressure sensor and the substrate may be disposed inside or outside the frame.

In the beam projector module, the optical substrate may include a first cover and a second cover forming a separated space therebetween inside the optical substrate, the sealed space may include the separated space between the first cover and the second cover, and the sensor may be disposed to measure a state of the separated space.

In the beam projector module, the optical substrate includes an air gap having pressure different from the pressure in the sealed space, and the beam projector module may further include an air gap sensor configured to measure a state of the air gap.

In the beam projector module, the processor may specify a crack occurrence position by comparing measured values of the sensor and the air gap sensor when a crack occurs, and the processor may be configured to operate the light source in an eye-safety mode the crack occurrence position is determined to be located in the optical device.

In the beam projector module, the sensor may be a concentration sensor, and the processor may be configured to operate the light source in an eye-safety mode when the measured value of the concentration sensor is lower than a reference concentration value.

In the beam projector module, the sealed space may be filled with a specific gas, and the concentration sensor may be configured to measure concentration of the specific gas.

In the beam projector module, the processor may be configured to operate the light source in an eye-safety mode depending on the measured value of the sensor, and in the eye-safety mode, light output from the light source may have a wavelength in an eye-safety free-band.

In the beam projector module, the light source may include a first sub-light source and a second sub-light source, and the processor outputs light using the first sub-light source in a normal mode, and using the second sub-light source in the eye-sight mode.

In the beam projector module, the optical substrate may include a first cover and a second cover, and the first cover may be hermetically sealed to the frame using a metal member disposed at an outer periphery thereof, the optical device may be attached to the second cover, and the second cover may be attached to the first cover such that the optical device is disposed between the first cover and the second cover.

In the beam projector module, the second cover may include a column, having a height greater than that of the optical device, may be disposed at an outer periphery of the second cover, and the second cover may be attached to the first cover by an adhesive applied to the outer periphery.

In the beam projector module, a space between side surfaces of the first cover and the second cover and the frame may be filled with a side filler.

Another embodiment provides a method of manufacturing a beam projector module. The method may include: providing a substrate having a light source attached thereto; attaching a frame to the substrate; disposing a metal member at an outer periphery of a first cover; pressing a portion, in which the metal member is disposed, against the frame; disposing an optical device on a second cover having a column disposed at an outer periphery thereof, the optical device being positioned in a further inner part compared with the column; bonding the second cover to the first cover using an adhesive such that the optical device is disposed between the first cover and the second cover; and filling a space between side surfaces of the first cover and the second cover and the frame with a side filler.

As described above, according to the embodiments disclosed herein, it is possible to safely protect a user's eyes even if an abnormality occurs in the beam projector module.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION OF THE EXEMPLARY EMBODIMENTS

Figure 1:
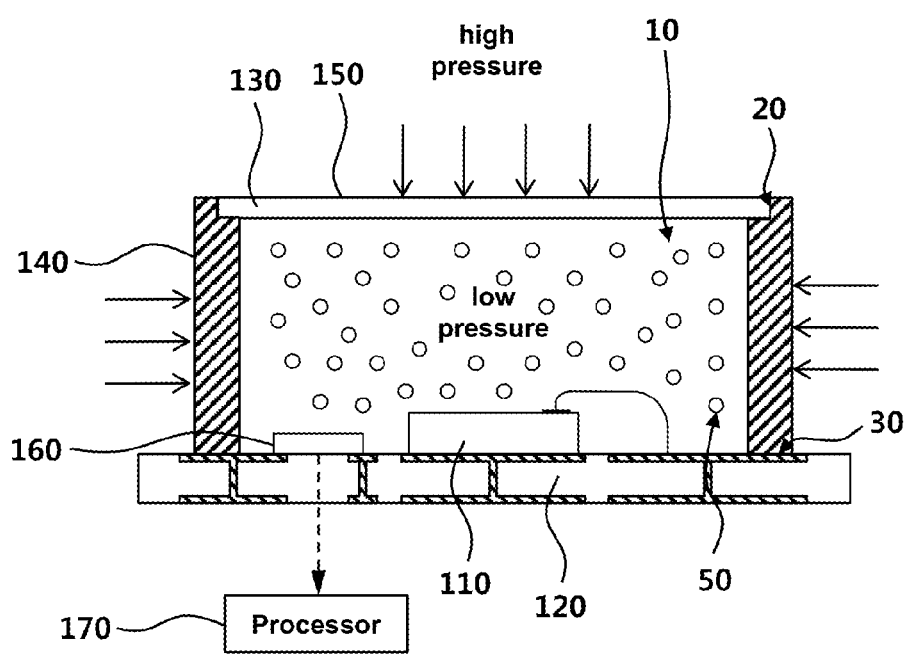
FIG. 1 is a cross-sectional view of a beam projector module according to a first embodiment.

Hereinafter, embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a cross-sectional view of a beam projector module according to a first embodiment.

Referring to FIG. 1, a beam projector module 100 may include a light source 110, a substrate 120, an optical device 130, a frame 140, an optical substrate 150, a sensor 160, a processor 170, and the like.

Wires may be patterned on the substrate 120. The substrate 120 may receive power from the outside, and the power may be supplied to the light source 110, the sensor 160, the processor 170, and the like through respective wires.

The light source 110 may be disposed on the substrate 120, an anode electrode of the light source 110 may be connected to an anode wire of the substrate 120, and a cathode electrode may be connected to a cathode wire of the substrate 120. The power supply to the light source 110 may be controlled by the processor 170, and the processor 170 may differently control the power supplied to the light source 110 in a normal mode and the power supplied to the light source 110 in an eye-safety mode. For example, the processor 170 may supply power to the light source 110 only in the normal mode, and may not supply power to the light source 110 in the eye-safety mode. As another example, the processor 170 may supply relatively less power to the light source 110 in the eye-safety mode than power in the normal mode.

The light source 110 may be disposed by being connected to the substrate 120 in a wire bonding manner. Alternatively, the light source 110 may be disposed on the substrate 120 through flip chip bonding without a wire. In the case where the light source 110 is connected to the substrate 120 through flip chip bonding, it is possible to configure a smaller-sized beam projector module because there is no wire line.

The light source 110 may include a vertical cavity surface-emitting laser (VCSEL).

The sensor 160 may receive power and may transmit and receive signals through wires on the substrate 120. The sensor 160 may be a pressure sensor, a concentration sensor, or the like, and the values measured by the sensor 160 will be described later.

The frame 140 may be disposed on the substrate 120 so as to surround the light source 110 such that a uniform space is defined around the light source 110. The frame 140 may be thermally conductive, and may thus transmit heat. The optical substrate 150 may be bonded to the upper side of the frame 140.

An optical device 130 such as a diffuser may be attached to the optical substrate 150. The optical device 130 may perform a function of reducing the intensity of light output from the light source 110. The optical device 130 may be disposed at a distance from the light source 110, and the frame 140 may separate the optical device 130 from the light source 110 by a predetermined distance.

A sealed space 10 may be defined by the substrate 120, the frame 140, and the optical substrate 150. The light source 110, the sensor 160, and the like may be disposed in the sealed space 10. The pressure in the sealed space 10 may be lower than the external pressure. Due to the pressure difference, the substrate 120, the frame 140, and the optical substrate 150 may receive strong pressure (high pressure) directed to the sealed space 10 from the outside, and the bonding force among the substrate 120, the frame 140, and the optical substrate 150 can be increased. A sealing technique that forms a sealed space 10 and makes the pressure inside the sealed space 10 lower than the external pressure may be referred to as hermetic sealing. Hereinafter, the term "hermetic sealing" is used for convenience of description.

The sealed space 10 may be filled with an inert gas. The pressure of the inert gas may be lower than the air pressure outside the frame.

The sensor 160 may be a pressure sensor, and the pressure sensor may measure the gas pressure in the sealed space 10. The processor 170 may operate the light source 110 in the eye-safety mode when the measured value of the pressure sensor measuring the pressure in the sealed space 10 is higher than a reference pressure value.

The sealed space 10 may be filled with a specific gas. The pressure of the specific gas may be lower than the air pressure outside the frame.

The sensor 160 may be a concentration sensor, and the concentration sensor may sense the concentration of the specific gas filled in the ensealed space 10. The processor 170 may operate the light source 110 in the eye-safety mode when the measured value of the concentration sensor is lower than the reference concentration value.

The processor 170 may operate the light source 110 in the eye-safety mode depending on the measured value of the sensor. The light output from the light source 110 in the eye protection mode may have a wavelength in an eye-safety free-band. For example, the wavelength of the eye-safety free-band may be 1050 nm. The wavelength of the eye-safety free-band may be defined in advance, and the corresponding band may be determined through tests such that a human eye is not affected or influenced in a range below the reference value.

The light source 110 may include a first sub-light source and a second sub-light source. The processor 170 may output light using the first sub-light source in the normal mode, and may output light using the second sub-light source in the eye-safety mode. Here, the second sub-light source may output light having a wavelength in the above-described eye-safety free-band.

Figure 2:
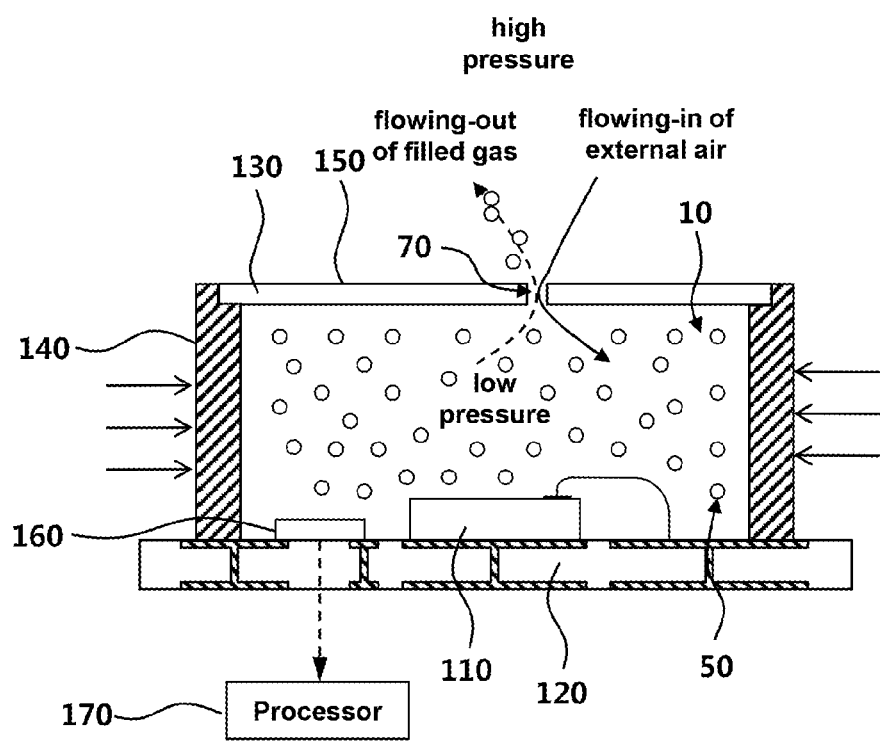
FIG. 2 is a view illustrating the state in which a crack is generated in the beam projector module of FIG. 1 and a seal is broken.

FIG. 2 is a view illustrating the state in which a crack is generated in the beam projector module of FIG. 1 and a seal is broken.

Referring to FIG. 2, when a crack 70 is generated in a portion of the beam projector module 100, air circulation occurs due to a pressure difference between the inner and outer sides, and the pressure of the inner space 10 is increased. Particularly, the crack 70 may be generated in the optical device 130 or the optical substrate 150. External air flows into the inner space through the crack 70, and the gas filled in the external space flows out. Then, the pressure in the inner space 10 rises, and the concentration of the filled gas becomes low.

Pressure is changed across a bonded portion. For example, when the inner space becomes a sealed space and a pressure difference occurs inside and outside the sealed space, a bonded portion of two plate materials is subjected to pressure corresponding to the pressure difference between the inner and outer sides of the bonded portion. A bonded portion 30 between the substrate and the frame and a bonded portion 20 between the frame and the optical structure described with reference to FIG. 1 receive the pressure due to such a pressure difference. The pressure across these bonded portions 20 and 30 gradually decreases as the pressure of the inner space rises due to a crack or the like.

The processor 170 senses the pressure or concentration change described above through the sensor 160, and may determine whether or not an abnormality has occurred in the beam projector module 100, for example, whether or not a crack has occurred. When it is determined that an abnormality has occurred in the beam projector module 100, the processor 170 may change the operation mode of the light source 110 so as to prevent injury to a user.

Figure 3:
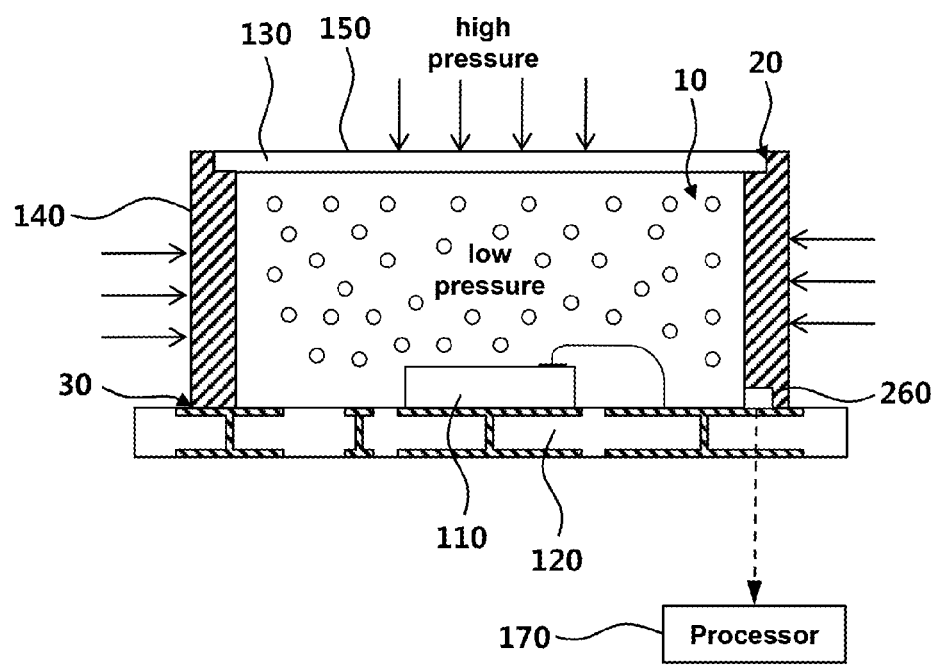
FIG. 3 is a cross-sectional view of a beam projector module according to a second embodiment.

FIG. 3 is a cross-sectional view of a beam projector module according to a second embodiment.

Referring to FIG. 3, a reflector 260 may be disposed on the substrate 120. A portion of the frame 140 may be bonded to the substrate 120 with pressing the sensor 260. When a pressure difference occurs between the inner space and the outside of the frame in this coupled structure, the sensor 260 is capable of receiving the pressure that varies depending on the pressure difference and is capable of measuring the pressure.

Meanwhile, when a crack occurs in the beam projector module 200, the pressure difference between the inner and outer sides of the beam projector may decrease since the external air is introduced into the beam projector so that the pressure of the space 10, which has been closed, i.e. the inner space increases. As a result, since the pressure applied to the bonded portions 20 and 30 between the frame 140 and the substrate 120 is reduced, the pressure received by the sensor 260 may be reduced. Thus, the sensor 260 measures a pressure lower than the reference pressure, and the processor 170 confirms the measured value (pressure value) of the sensor 260. When the measured value becomes lower than the reference value, the processor 170 may determine that the beam projector module 200 is abnormal. In addition, the processor 170 may operate the light source 110 in an eye-safety mode.

In this way, the sensor 260 may indirectly measure the state (pressure) of the sealed space by measuring the pressure difference between the inside and outside of the beam projector module at the bonded portions between the frame 140 and the substrate 120.

When the sensor 260 is disposed in this manner, the arrangement of the wires connected to the sensor 260 is facilitated, and the electrical connection between the sensor 260 and the processor 170 may be facilitated.

Figure 4:
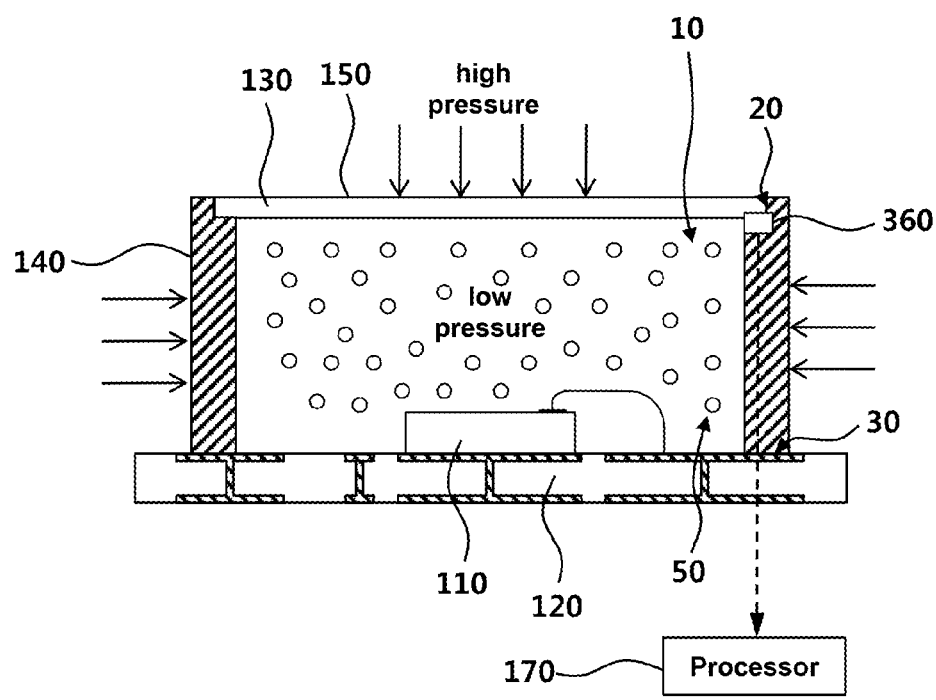
FIG. 4 is a cross-sectional view of a beam projector module according to a third embodiment.

FIG. 4 is a cross-sectional view of a beam projector module according to a third embodiment.

Referring to FIG. 4, a sensor 360 may be disposed on the frame 140. A portion of the optical substrate 150 may be bonded to the frame 140 while pushing the sensor 360. When a pressure difference occurs between the inner space and the outside of the frame in this coupled structure, the sensor 360 is capable of receiving the pressure that varies in proportion to the pressure difference and is capable of measuring the pressure.

Meanwhile, when a crack occurs in the beam projector module 300, the pressure difference between the inner and outer sides of the beam projector may decrease since the external air is introduced into the beam projector so that the pressure of the space 10, which has been closed, i.e. the inner space increases. As a result, since the pressure applied to the bonded portion 20 between the frame 140 and the substrate 150 is reduced, the pressure received by the sensor 360 may be reduced. Thus, the sensor 360 measures a pressure lower than the reference pressure, and the processor 170 checks the measured value (pressure value) of the sensor 360. When the measured value becomes lower than the reference value, the processor 170 may determine that the beam projector module 300 is abnormal.

In this way, the sensor 360 may indirectly measure the state (pressure) of the sealed space 10 by measuring the pressure difference between the inside and outside of the beam projector module at the bonded portion 20 between the frame 140 and the optical substrate 150.

Meanwhile, when the sensor 360 is disposed in this way, the processor 170 is capable of accurately determining whether or not the optical substrate 150 is properly attached to the frame 140. For example, when the coupling between the optical substrate 150 and the frame 140 is inappropriate, there is a problem in that the light output from the light source 110 may be directly transmitted to a human eye without being scattered on the optical substrate 150. The controller 170 is capable of correctly grasping such a problem through the above-described arrangement structure.

Figure 5:
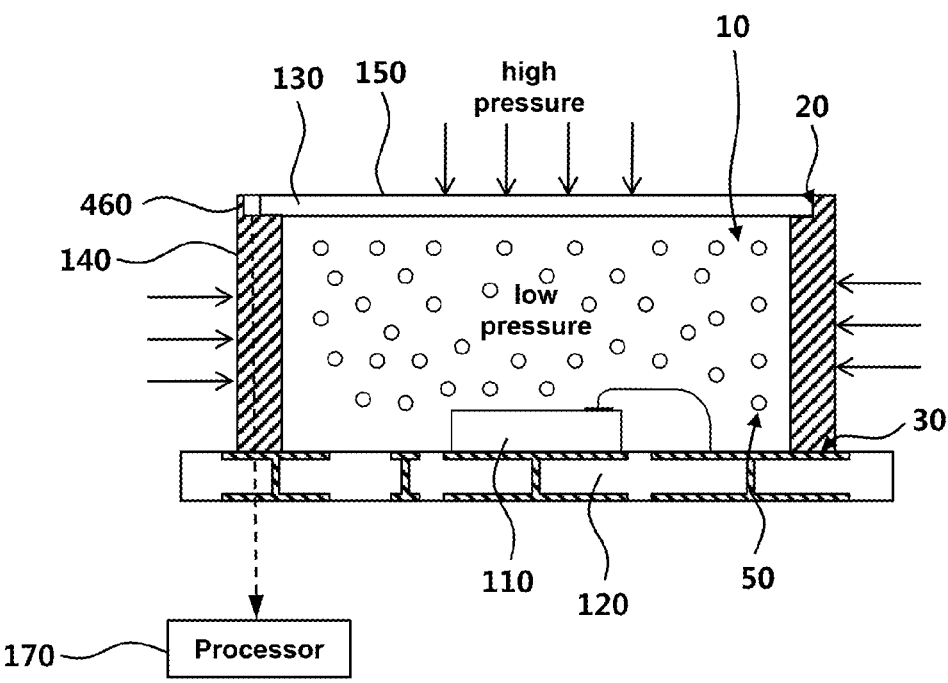
FIG. 5 is a cross-sectional view of a beam projector module according to a fourth embodiment.

FIG. 5 is a cross-sectional view of a beam projector module according to a fourth embodiment.

Figure 6:
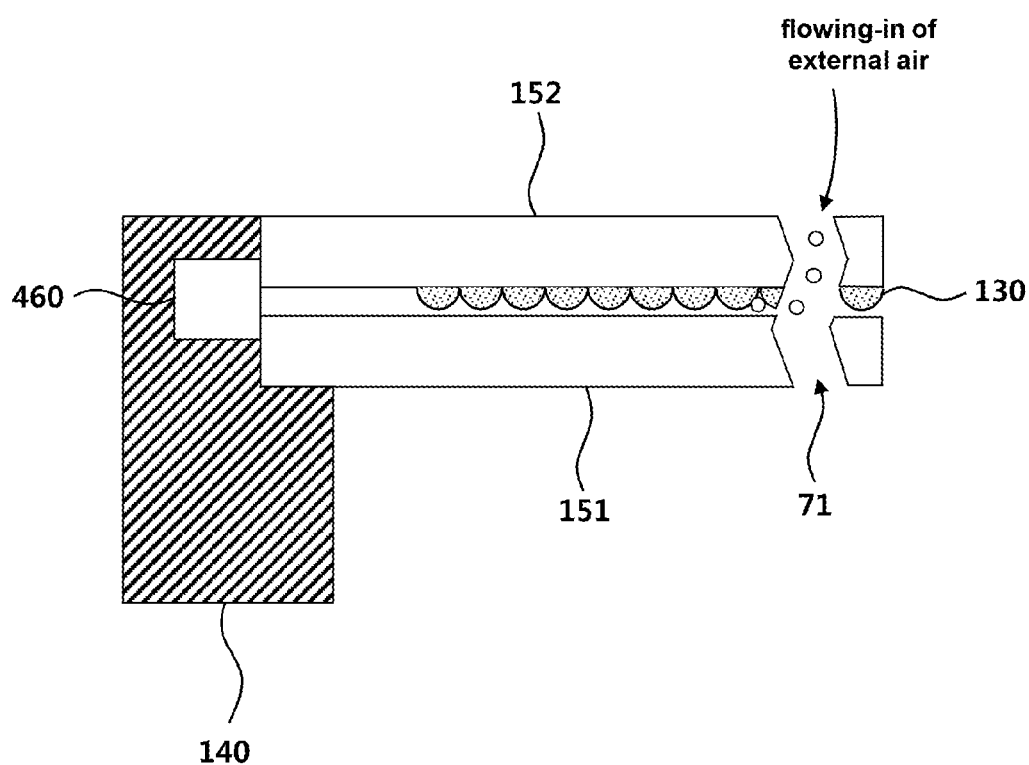
FIG. 6 is a view illustrating the case in which a crack is generated in the beam projector module according to the fourth embodiment.

FIG. 6 is a view illustrating the case in which a crack is generated in the beam projector module according to the fourth embodiment.

Referring to FIGS. 5 and 6, the optical substrate 150 may include a first cover 151 and a second cover 152. The separated space between the first cover 151 and the second cover 152 may be a sealed space like the inner space. In addition, the sensor 460 may be disposed to be in contact with the bonded portion between the frame 140 and the first cover 151 and the bonded portion between the frame 140 and the second cover 152. The sensor 460 may measure the state of the separated space between the first cover 151 and the second cover 152.

The sensor 460 may be a pressure sensor and may measure the pressure in the separated space between the first cover 151 and the second cover 152. The processor 170 may check the pressure value of the sensor 460, and when the pressure in the separated space becomes higher than the reference pressure value, the processor 170 may determine that the beam projector module 400 is abnormal.

For example, when cracks 71 are generated in the first cover 151 and the second cover 152 as illustrated in FIG. 6, the air outside the beam projector may flow into the separated space and thus, the pressure in the space may increase. At this time, the sensor 460 may measure the increased pressure in the separated space, and the processor 170 may operate the light source 110 in the eye-safety mode when the measured pressure value is greater than the reference pressure value.

The separated space may be filled with a specific gas, and the sensor 460 may be a concentration sensor. The sensor 460 may measure the concentration of the specific gas in the separated space between the first cover 151 and the second cover 152. The processor 170 may check the concentration value of the specific gas measured by the sensor 460, and when the concentration value in the separated space is lower than the reference concentration value, the processor 170 may determine that the beam projector module 400 is abnormal.

For example, when cracks 71 are generated in the first cover 151 and the second cover 152 as illustrated in FIG. 6, the air outside the beam projector may flow into the separated space between the first cover 151 and the second cover 152 and the specific gas may flow out from the separated space. Thus, the concentration of the specific gas may decrease. At this time, the sensor 460 may measure the decreased concentration of the specific gas, and the processor 170 may operate the light source 110 in the eye-safety mode when the measured concentration value is lower than the reference concentration value.

Meanwhile, when the sensor 460 is disposed as described above, the sensor 460 is capable of more directly measuring whether or not cracks are generated in the optical device 130 and the optical substrate 150.

Figure 7:
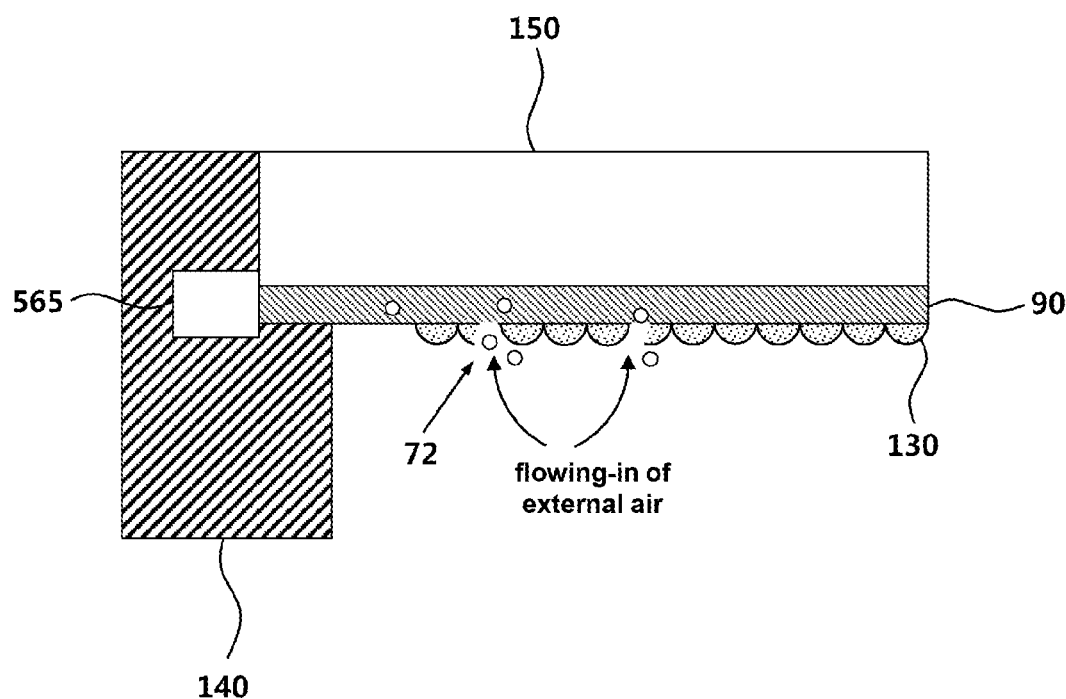
FIG. 7 is a view illustrating the case in which a crack is generated in the beam projector module according to the fifth embodiment.

FIG. 7 is a view illustrating the case in which a crack is generated in the beam projector module according to the fifth embodiment.

A beam projector module 500 may include a light source 110, a substrate 120, an optical device 130, a frame 140, an optical substrate 150, a sensor, a processor 170, and the like. The sensor may be disposed on a substrate or on a bonded portion between the frame 140 and the optical substrate 150 or between the frame 140 and the substrate 130. FIG. 7 is an enlarged view of a part of the beam projector module 500. Referring to FIG. 7, the optical substrate 150 may include an air gap 90. Alternatively, the optical substrate 150 may include a first cover and a second cover, and may include an optical device 130 on at least one of the first and second covers. The air gap 90 may be disposed in the cover including the optical device 130.

The air gap 90 may be sealed by the optical device 130 and the optical substrate 150. In addition, the pressure in the sealed air gap 90 may be different from the pressure in the sealed space of the beam projector module.

In addition, the beam projector module 500 may further include an air gap sensor 565 for measuring the state of the air gap 90 in addition to the sensors 160, 260, 360, and 460 described above with reference to FIGS. 1 to 6.

The air gap sensor 565 may be a pressure sensor. The air gap sensor 565 is capable of measuring the pressure in the air gap 90. When the measured pressure value is higher than the reference pressure value, the processor 170 may operate the light source 110 in the eye-safety mode.

Meanwhile, when an abnormality such as a crack 72 occurs in the optical device 130, air outside the air gap 90 is capable of being introduced into the air gap 90. Accordingly, the pressure inside the air gap 90 may increase. At this time, the processor 170 may specify a crack occurrence position by comparing the pressure value measured by the air gap sensor 565 with the pressure value measured by the sensors 160, 260, 360, and 460.

For example, when an abnormality such as a crack 72 occurs in the optical device 130, the pressure inside the air gap 90 may increase, and the pressure value measured by the air gap sensor 565 may be high. At this time, the processor 170 may determine that a crack has occurred in the optical device 150, and may operate the light source 110 in the eye-safety mode.

Meanwhile, when an abnormality such as a crack occurs in the substrate 120 or the frame 140, the pressure or concentration measured by the sensors 110, 260, 360, and 460 may vary by a predetermined range in excess of the reference value. However, since no abnormality has occurred in the optical device 130, the pressure value measured by the air gap sensor 565 may be the same as in the case where no crack occurs. In this case, the processor 170 may determine that a crack has occurred in a place other than the optical device 130, and may operate the light source 110 in the normal mode at this time.

In addition, the air gap 90 may be filled with a specific gas. When the air gap 90 is filled with the specific gas, the air gap sensor 565 may measure the concentration change of the specific gas in the air gap 90. Even when the air gap sensor 565 measures the concentration change of the specific gas, the processor 170 may specify the crack occurrence position in the same manner as in the case of measuring the above-described pressure change, and may operate the light source 110 in the eye-safety mode when a crack has occurred.

When the beam projector module 500 includes the air gap sensor 565, it may be possible to directly determine whether or not the optical device 130 is cracked. The optical device 130 scatters light to reduce the intensity of light. Therefore, when an abnormality occurs in the frame 140, the substrate 120, or the like, the user's eyes may be seriously damaged unlike in the case in which an abnormality occurs in the optical device 130. Therefore, when the processor 170 changes the operation mode of the light source 110 depending on the crack occurrence position, the eye-safety mode is operated only when the user's eyes may be damaged, and thus it is possible to enhance the operating efficiency of the beam projector module 500.

Figure 8:
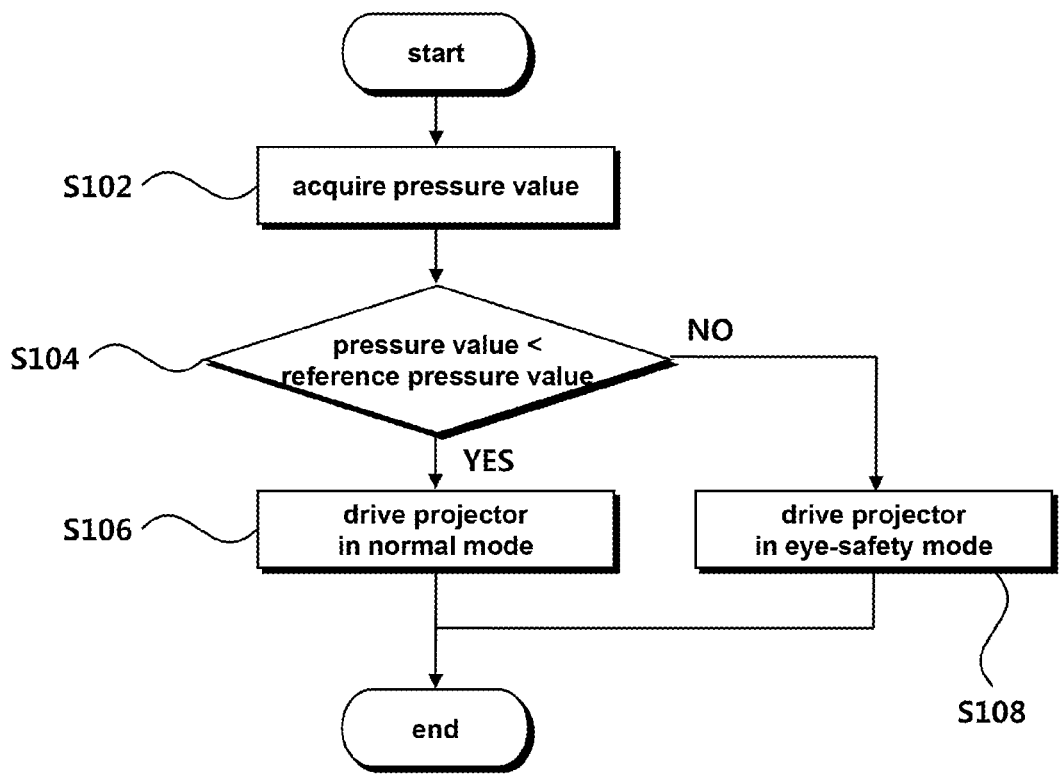
FIG. 8 is a flowchart illustrating a process of changing, by a processor according to an embodiment of the present disclosure, an operating mode depending on a pressure value.

FIG. 8 is a flowchart illustrating a process of changing, by a processor according to an embodiment of the present disclosure, an operating mode depending on a pressure value.

Referring to FIG. 8, the processor may obtain a pressure value from a sensor (S102). Here, the pressure value may be the pressure in the inner space (sealed space).

The processor may determine whether or a measured pressure value is lower than the reference pressure value (S104).

The processor may drive the light source in the normal mode when the pressure value is lower than the reference pressure (S106). When the pressure value is higher than the reference pressure, the processor may drive the light source in the eye-safety mode (S108). In the eye-safety mode, the processor may turn off the light source or reduce the power supply to the light source.

Unlike this, the pressure value may be the bonding force of a bonded portion (for example, a bonded portion between the substrate and the frame or a bonded portion between the frame and the optical substrate). In this case, the processor may compare the pressure value with the reference pressure value, and when the pressure value is higher than the reference pressure value, the processor may drive the light source in the normal mode. In addition, when the pressure value is lower than the reference pressure value, the processor may drive the light source in the eye-safety mode.

Figure 9:
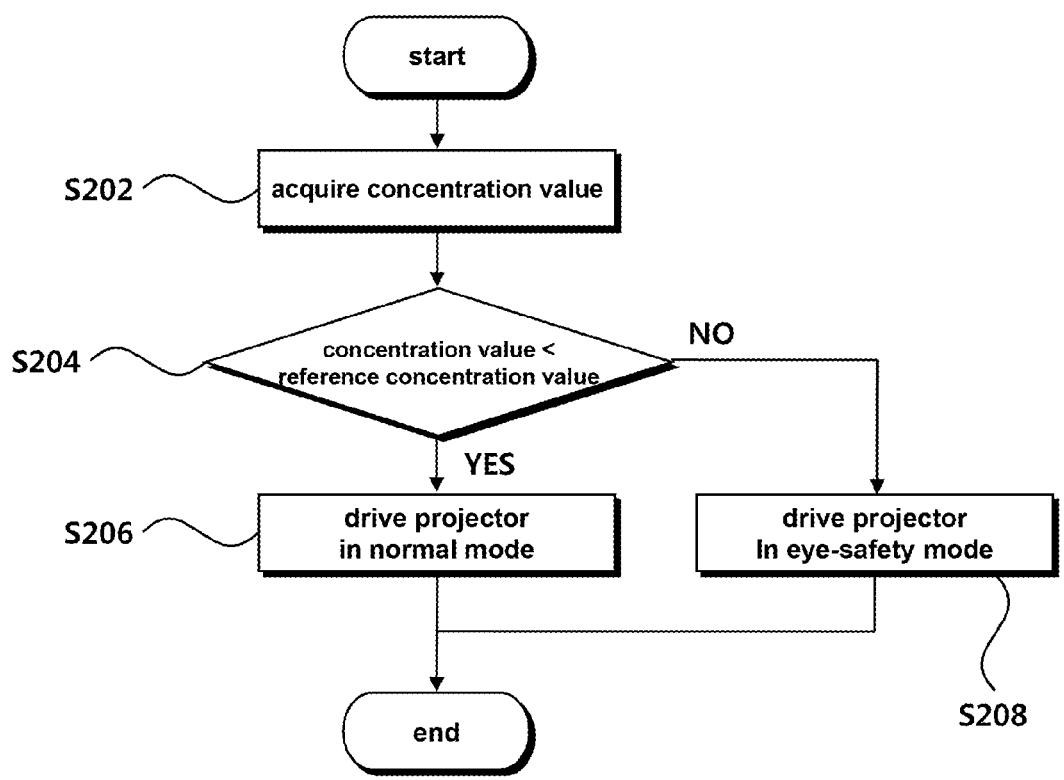
FIG. 9 is a flowchart illustrating a process of changing, by a processor according to an embodiment of the present disclosure, an operating mode depending on a concentration value.

FIG. 9 is a flowchart illustrating a process of changing, by a processor according to an embodiment of the present disclosure, an operating mode depending on a concentration value.

Referring to FIG. 9, the processor may obtain a concentration value from a sensor (S202). Here, the concentration value may be the concentration of a gas filled in the inner space.

The processor may determine whether or a measured pressure value is lower than the reference pressure value (S204).

When the concentration value is higher than the reference concentration value, the processor may drive the light source in the normal mode (S206). In addition, when the concentration value is higher than the reference concentration value, the processor may drive the light source in the eye-safety mode (S208).

The concentration value may be the concentration value of an inert gas or a specific gas filled in the inner space. When the concentration value of the inert gas or the specific gas is higher than the reference concentration value, the processor may drive the light source in the normal mode. In addition, when the concentration value of the inert gas or the specific gas is lower than the reference concentration value, the processor may drive the light source in the eye-safety mode.

Figure 10:
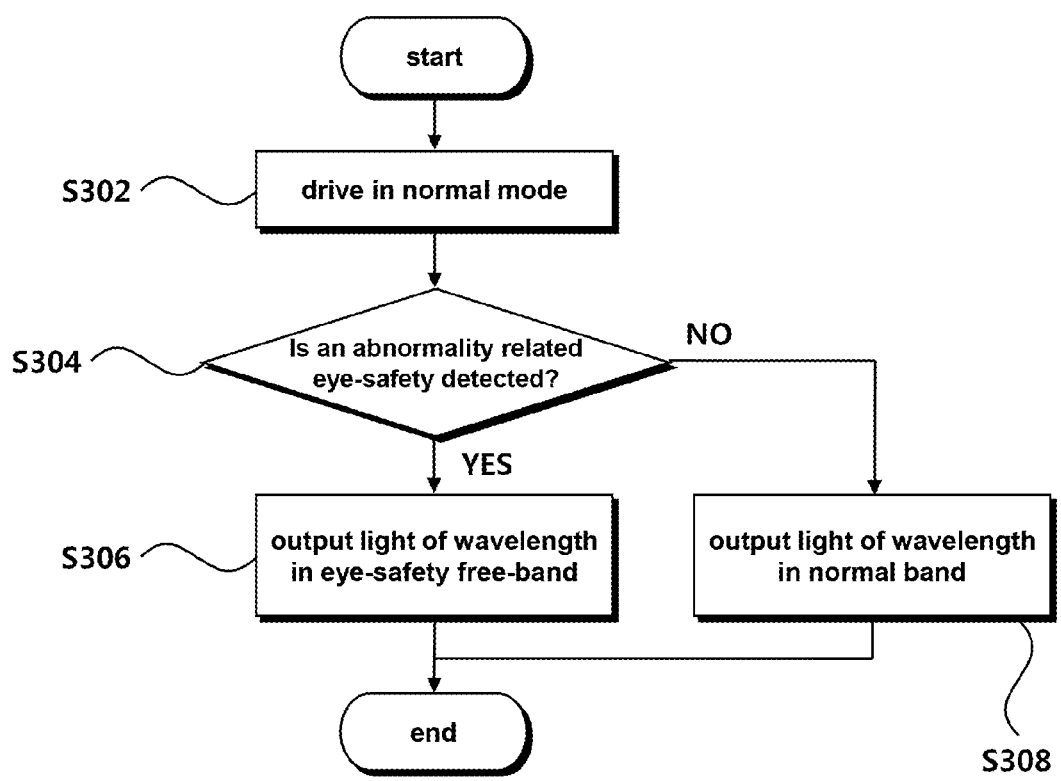
FIG. 10 is a flowchart illustrating a process of driving light in an eye-safety free band in a beam projector module according to an embodiment of the present disclosure.

FIG. 10 is a flowchart illustrating a process of driving light in an eye-safety free band in a beam projector module according to an embodiment of the present disclosure.

Referring to FIG. 10, the processor may drive the light source in the normal mode (S302). In the normal mode, the light may have a wavelength in a normal band that is generally used.

Then, the processor may detect an abnormality related to eye-safety (S304).

When the processor detects an abnormality related to eye-safety, the processor may control the light source to output light having a wavelength in an eye-safety free-band (S306).

When the abnormality related to eye-safety is not detected, the processor may control the light source to output light continuously having a wavelength in the normal band (S308).

The eye-safety free-band refers to a wavelength band that does not cause a decrease in visual acuity or has a small influence on a decrease in visual acuity. For example, a wavelength of 1050 nm may correspond to the eye-safety free-band.

The light source 110 may further include a light transducer that changes the wavelength, and the processor 170 may enable light to be output through the light transducer in the eye-safety mode.

The light source 110 may include a first sub-light source configured to output a wavelength in the normal band and a second sub-light source configured to output a wavelength in the eye-safety free-band. In addition, the processor 170 may output light using the first sub-light source in the normal mode, and may output light using the second sub-light source in the eye-safety mode.

Figure 11:
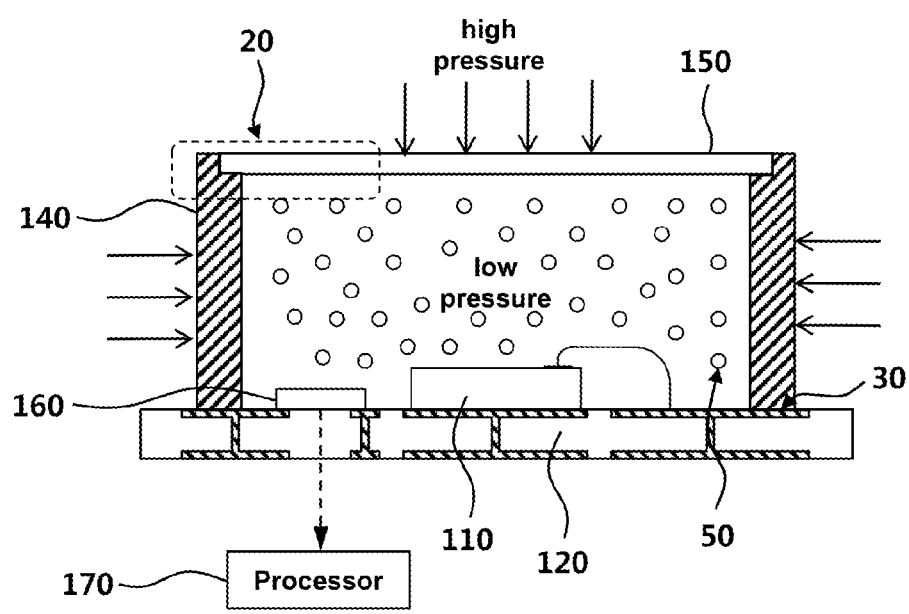
FIG. 11 is a view illustrating a portion in which hermetic sealing is formed in a beam projector module according to an embodiment of the present disclosure.
Figure 12:
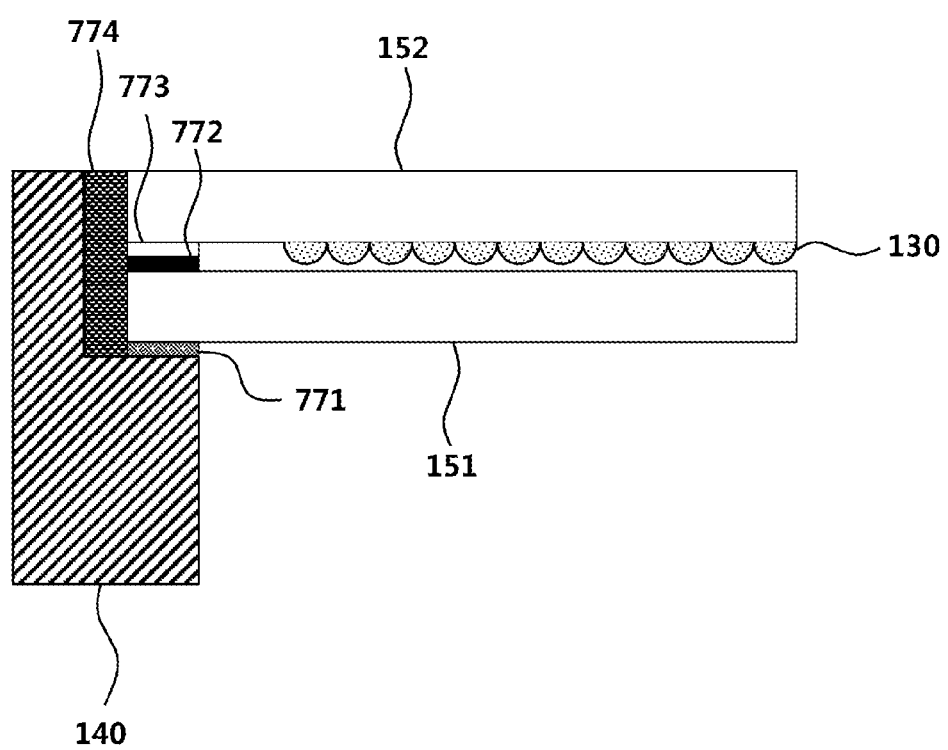
FIG. 12 is an enlarged view of a hermetically sealed portion indicated in FIG. 11.

FIG. 11 is a view illustrating a portion in which hermetic sealing is formed in a beam projector module according to an embodiment of the present disclosure, and FIG. 12 is an enlarged view of a hermetically sealed portion indicated in FIG. 11.

FIGS. 13 to 17 illustrate respective steps of a method for hermetically sealing a beam projector module according to an embodiment.

Referring to FIG. 11, the bonded portion between the optical substrate 150 and the frame 140 in the beam projector module may be hermetically sealed.

Referring to FIG. 12, the optical substrate 150 may include a first cover 151 and a second cover 152. The first cover 151 may be hermetically sealed to the frame 140 by a metal member 771 disposed at the outer periphery thereof. The optical device 130 may be attached to the second cover 152. The second cover 152 may be attached to the first cover 151 such that the optical device 130 is disposed between the first cover 151 and the second cover 152. A column may be disposed at the outer periphery of the second cover 152 higher than the optical device 150, and the second cover 152 may be attached to the first cover 151 using an adhesive 772 (for example, epoxy) applied to the outer periphery. A space between the side surfaces of the first cover 151 and the second cover 152 and the frame 140 may be filled with a side filler 774.

Figure 13:
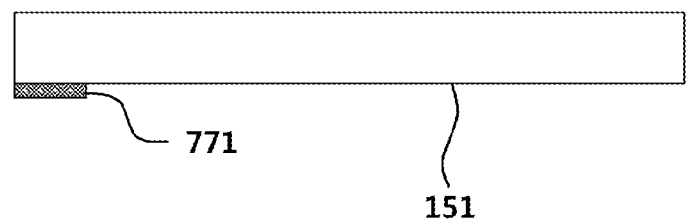
FIGS. 13 to 17 illustrate respective steps of a method for hermetically sealing a beam projector module according to an embodiment.

Referring to FIG. 13, after providing the substrate 120 to which the light source 110 is attached and attaching the frame 140 to the substrate 120, a metal member 771 may be attached to the outer periphery of the first cover 151. The metal member 771 may be, for example, silver (Au).

Figure 14:
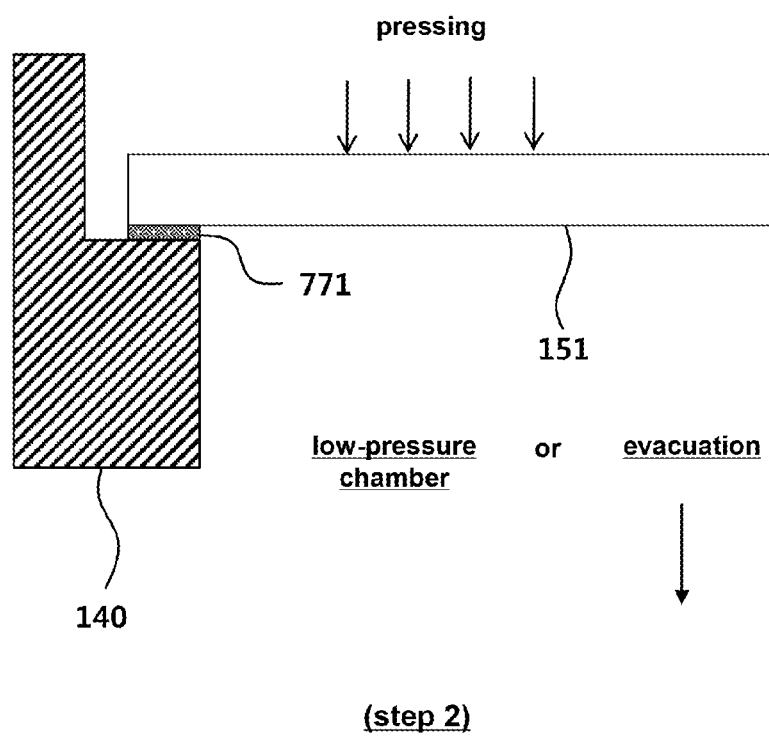

Referring to FIG. 14, a portion of the first cover 151 to which the metal member 771 is attached may be pressed onto the frame 140. At this time, hermetic sealing is formed between the optical substrate 150 and the frame 140. A hermetic sealing process may be performed between the optical substrate 150 and the frame 140 in a vacuum chamber or a low-pressure chamber to lower the pressure in the internal space defined by the optical substrate 150, the frame 140, and the substrate 120. Alternatively, after the optical substrate 150 and the frame 140 are hermetically sealed, air in the inner space may be exhausted using a vacuum exhaust system.

Figure 15:
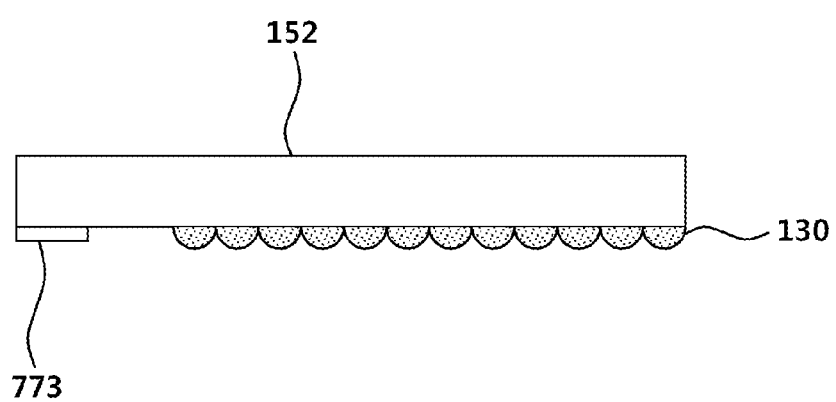

Referring to FIG. 15, an optical device 130 (e.g., a diffuser) may be disposed on one surface of the second cover 152. In addition, a column 773 having a thickness larger than the height of the optical device 130 may be disposed at the outer periphery of the same surface of the second cover 152.

Figure 16:
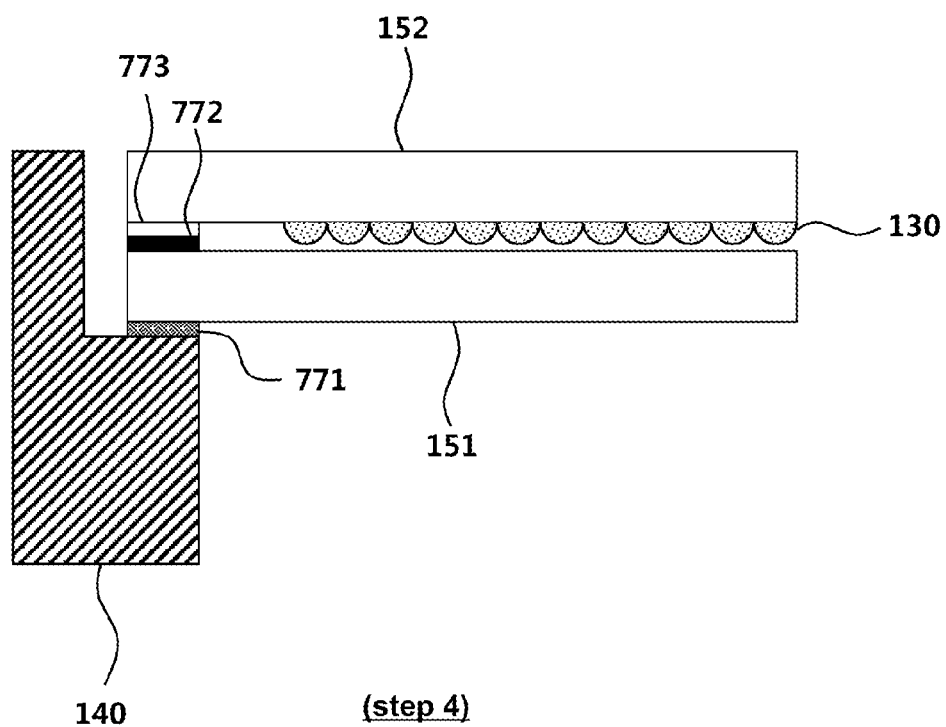

Referring to FIG. 16, the second cover 152 may be attached to the first cover 151 using an adhesive 772. For example, epoxy 772 may be applied to the portion of the column 773 of the second cover 152, the second cover 152 may be attached to the first cover 151 using the epoxy.

When the second cover 152 is attached to the first cover 151, the optical device 130 is surrounded by the first cover 151 and the second cover 152 and the peripheral space of the optical device 130 may be sealed.

Figure 17:
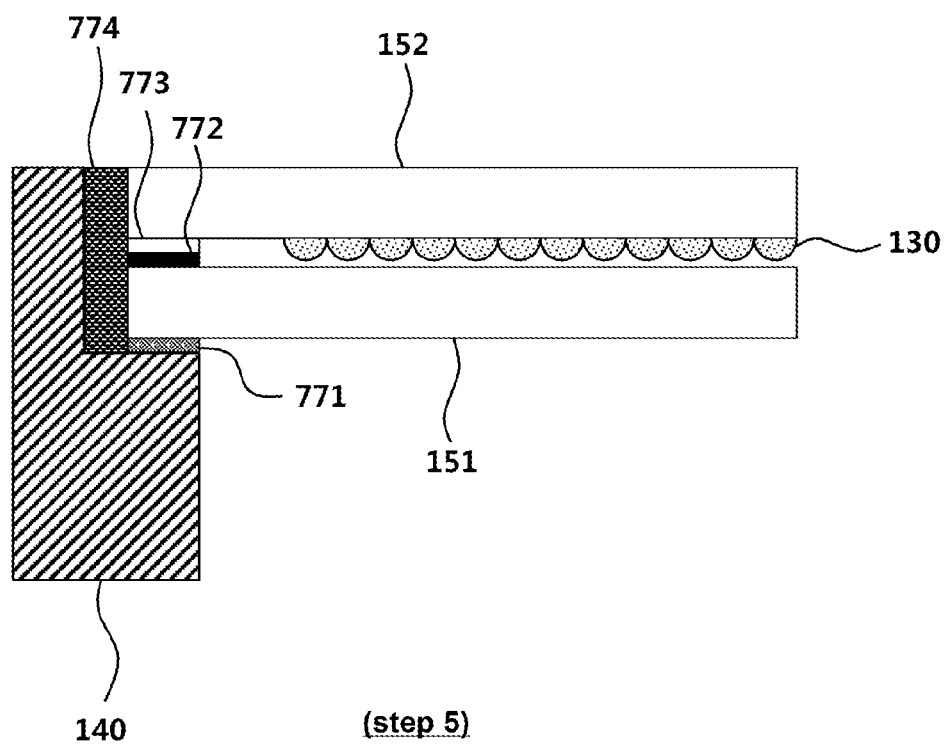

Referring to FIG. 17, the space between the side surfaces of the first cover 151 and the second cover 152 and the frame 140 may be filled with a side filler 774.

When the optical substrate 150 is constituted with a double cover, various effects may be additionally generated.

Figure 18:
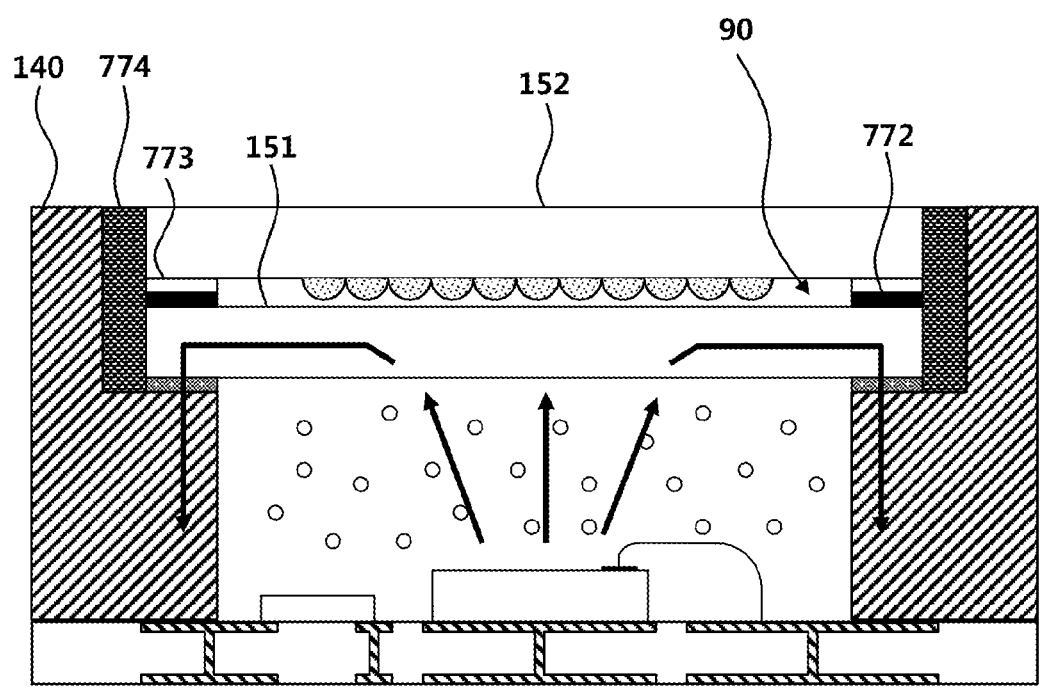
FIG. 18 is a view for describing the effect when an optical substrate according to an embodiment of the present disclosure is formed as a double cover.

FIG. 18 is a view for describing the effect when an optical substrate according to an embodiment of the present disclosure is formed as a double cover.

Referring to FIG. 18, as the first cover 151 and the second cover 152 are attached to each other with a predetermined spacing therebetween, a space 90 is formed between the first cover 151 and the second cover 152. In addition, the optical device 130 may be disposed in the space 90.

In the light source 110, high-temperature heat may be generated and may be transferred to the peripheral configuration through convection or radiation. At this time, since the first cover 151 primarily absorbs the heat output from the light source 110 and emits the heat to the outside through the frame 140, the optical device 130 located in the space 90 receives relatively less heat of the light source 110.

Meanwhile, through the space 90, the optical device 130 is blocked from the contact with the external air and is also blocked from the contact with the gas filled in the inner space. When contact with the ambient air increases, the optical device 130 is more likely to be oxidated. However, since the optical device 130 according to an embodiment is placed in the space 90, it is possible to reduce the risk of such oxidation.

Figure 19:
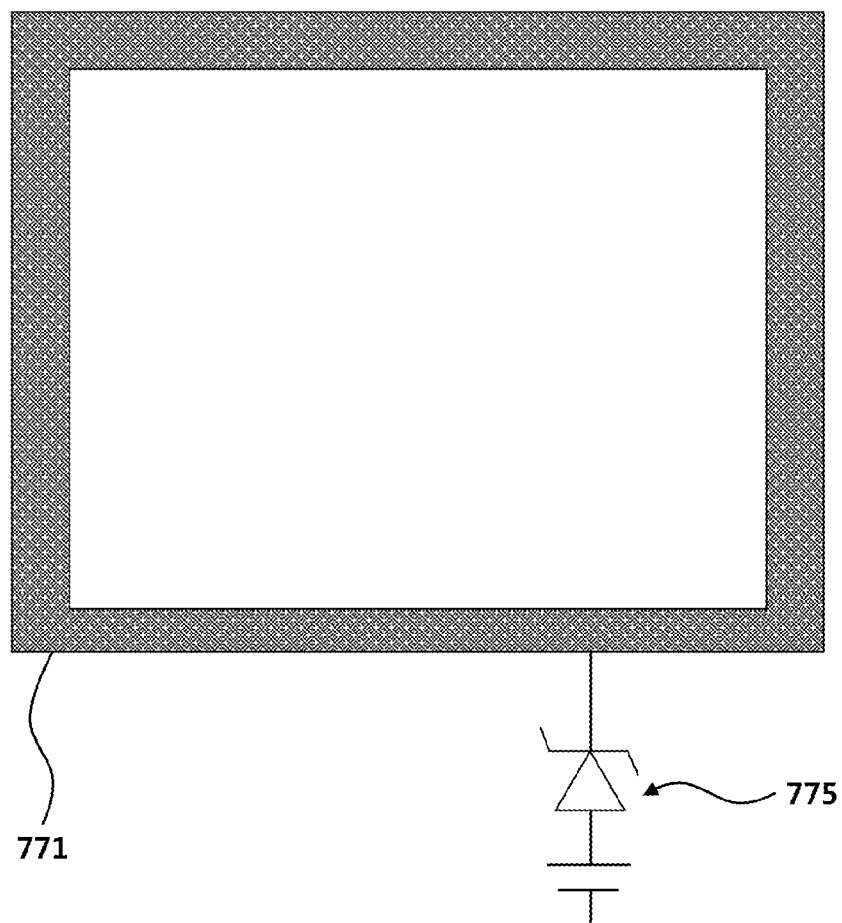
FIG. 19 is a view illustrating that a metal member of an optical substrate according to an embodiment of the present disclosure is utilized as an electrostatic discharge path of ESD.

FIG. 19 is a view illustrating that a metal member of an optical substrate according to an embodiment of the present disclosure is utilized as an electrostatic discharge path of ESD.

Referring to FIG. 19, a metal member 771 disposed at the outer periphery of the optical substrate 150 may be used not only for hermetic sealing but also as an electrostatic discharge path of electro-static discharge (ESD) input into a beam projector module.

The metal member 771 may be connected to an ESD discharge circuit 775 (e.g., a circuit including a Zener diode) through a wire disposed outside or inside the frame 140. In addition, the metal member 771 is capable of transmitting ESD charges to the ESD discharge circuit when the ESD is input into the beam projector module.

As described above, according to the embodiments disclosed herein, it is possible to safely protect a user's eyes even if an abnormality occurs in the beam projector module.

Since terms, such as "including," "comprising," and "having" mean that corresponding elements may exist unless they are specifically described to the contrary, it shall be construed that other elements can be additionally included, rather than that such elements are omitted. All technical, scientific or other terms are used consistently with the meanings as understood by a person skilled in the art unless defined to the contrary. Common terms as found in dictionaries should be interpreted in the context of the related technical writings, rather than overly ideally or impractically, unless the present disclosure expressly defines them so.

Although a preferred embodiment of the present disclosure has been described for illustrative purposes, those skilled in the art will appreciate that various modifications, additions and substitutions are possible, without departing from the scope and spirit of the embodiment as disclosed in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A beam projector module comprising:
   a light source configured to output light;
   a substrate configured to support the light source;
   an optical device configured to reduce the light in terms of intensity output to a predetermined space;
   a frame configured to separate the optical device from the light source by a predetermined distance;
   an optical substrate configured to attach the optical device thereto and to define a sealed space with the substrate and the frame, the sealed space having internal pressure lower than pressure outside the sealed space;
   a sensor configured to measure a state of the sealed space; and
   a processor configured to change an operation mode of the light source depending on a measured value of the sensor.

2. The beam projector module of claim 1, wherein the sealed space is filled with an inert gas, and pressure of the inert gas is lower than air pressure outside the frame.

3. The beam projector module of claim 1, wherein the sensor is a pressure sensor, and
   the processor is operates the light source in an eye-safety mode when the measured value of the pressure sensor is higher than a reference pressure value.

4. The beam projector module of claim 3, wherein the pressure sensor measures the pressure in the sealed space.

5. The beam projector module of claim 1, wherein the sensor is a pressure sensor,
   the pressure sensor is located in a bonded portion between two of the substrate, the frame, and the optical substrate to measure a bonding force of the bonded portion, and
   the processor operates the light source in an eye-safety mode when the measured value of the pressure sensor is lower than a reference pressure value.

6. The beam projector module of claim 5, wherein the pressure sensor is disposed on the substrate, and a portion of the frame is bonded to the substrate with pressing the pressure sensor.

7. The beam projector module of claim 5, wherein the pressure sensor is located in a bonded portion between the frame and the optical substrate, and a wire connecting the pressure sensor and the substrate is disposed inside or outside the frame.

8. The beam projector module of claim 1, wherein the optical substrate comprises a first cover and a second cover forming a space therebetween inside the optical substrate, the sealed space comprises the space between the first cover and the second cover, and
the sensor is disposed to measure a state of the space.

9. The beam projector module of claim 1, wherein the optical substrate comprises an air gap having pressure different from the pressure in the sealed space, and
the beam projector module further comprises an air gap sensor configured to measure a state of the air gap.

10. The beam projector module of claim 9, wherein the processor specifies a crack occurrence position by comparing measured values of the sensor and the air gap sensor when a crack occurs, and
the processor operates the light source in an eye-safety mode when the crack occurrence position is determined to be located in the optical device.

11. The beam projector module of claim 1, wherein the sensor is a concentration sensor, and
the processor operates the light source in an eye-safety mode when the measured value of the concentration sensor is lower than a reference concentration value.

12. The beam projector module of claim 11, wherein the sealed space is filled with a specific gas, and the concentration sensor measures concentration of the specific gas.

13. The beam projector module of claim 1, wherein the processor operates the light source in an eye-safety mode depending on the measured value of the sensor, and
in the eye-safety mode, light output from the light source has a wavelength in an eye-safety free-band.

14. The beam projector module of claim 13, wherein the light source comprises a first sub-light source and a second sub-light source, and the processor outputs light using the first sub-light source in a normal mode, and using the second sub-light source in an eye-safety mode.

15. The beam projector module of claim 1, wherein the optical substrate comprises a first cover and a second cover, the first cover is hermetically sealed to the frame using a metal member disposed at an outer periphery thereof, the optical device is attached to the second cover, and the second cover is attached to the first cover such that the optical device is disposed between the first cover and the second cover.

16. The beam projector module of claim 15, wherein the second cover comprises a column, having a height greater than that of the optical device, disposed at the outer periphery of the second cover, and wherein the second cover is attached to the first cover by an adhesive applied to the outer periphery.

17. The beam projector module of claim 15, wherein a space between side surfaces of the first cover and the second cover and the frame is filled with a side filler.

18. A method of manufacturing a beam projector module, the method comprising:
providing a substrate having a light source attached thereto;
attaching a frame to the substrate;
disposing a metal member at an outer periphery of a first cover;
pressing a portion, in which the metal member is disposed, against the frame;
disposing an optical device on a second cover having a column disposed at an outer periphery thereof, the optical device being positioned in a further inner part compared with the column;
bonding the second cover to the first cover using an adhesive such that the optical device is disposed between the first cover and the second cover; and filling a space between side surfaces of the first cover and the second cover and the frame with a side filler.

* * * * *